(12) United States Patent
Powell et al.

(10) Patent No.: US 9,075,697 B2
(45) Date of Patent: Jul. 7, 2015

(54) PARALLEL DIGITAL FILTERING OF AN AUDIO CHANNEL

(75) Inventors: Richard M. Powell, Mountain View, CA (US); Aram M. Lindahl, Menlo Park, CA (US)

(73) Assignee: Apple Inc., Cupertino, CA (US)

( * ) Notice: Subject to any disclaimer, the term of this patent is extended or adjusted under 35 U.S.C. 154(b) by 271 days.

(21) Appl. No.: 13/602,032

(22) Filed: Aug. 31, 2012

(65) Prior Publication Data

US 2014/0067100 A1    Mar. 6, 2014

(51) Int. Cl.
| | |
|---|---|
| *G06F 17/00* | (2006.01) |
| *G11B 27/10* | (2006.01) |
| *H03H 17/00* | (2006.01) |
| *H04B 1/20* | (2006.01) |
| *H03H 17/02* | (2006.01) |

(52) U.S. Cl.
CPC ............... *G06F 17/00* (2013.01); *G11B 27/10* (2013.01); *H03H 17/00* (2013.01); *H03H 17/0233* (2013.01); *H03H 17/0283* (2013.01); *H04B 1/20* (2013.01)

(58) Field of Classification Search
CPC .............. G11B 20/10046; G11B 20/10259; G11B 27/038; G11B 27/10; G11B 27/102; G11B 2020/10546; G11B 2020/10564; H03G 5/025; H03G 5/165
USPC ............................................. 700/94; 381/98
See application file for complete search history.

(56) References Cited

U.S. PATENT DOCUMENTS

| | | | |
|---|---|---|---|
| 5,432,723 A | 7/1995 | Chen et al. | |
| 5,835,895 A | 11/1998 | Stokes, III | |
| 7,159,002 B2 | 1/2007 | Gurrapu | |
| 7,584,235 B2 | 9/2009 | Ferguson | |
| 2004/0267520 A1* | 12/2004 | Holley, II | 704/201 |
| 2010/0046648 A1* | 2/2010 | Nerella et al. | 375/260 |
| 2010/0325184 A1* | 12/2010 | Kanayama et al. | 708/300 |
| 2011/0293103 A1 | 12/2011 | Park et al. | |
| 2011/0304773 A1* | 12/2011 | Okumura | 348/607 |
| 2012/0213375 A1* | 8/2012 | Mahabub et al. | 381/17 |

OTHER PUBLICATIONS

Francis, Michael, "Infinite Impulse Response Filter Structures in Xilinx FPGAs", Xilinx® WP330, (v1.2,) Aug. 10, 2009, White Paper: Spartan®-3A DSP, Virtex®-5/Vertix-4 FPGAs, Logic-CORE™ IP, pp. 1-19.
Google Answers, "Tips for crossfades in digital audio editing?", Retrieved on Sep. 19, 2012 from Internet: http://answers.google.com/answers/threadview/id/60928.html;, (2002), 4 pages.
Kutil, Rade, "Parallelization of IIR Filters Using SIMD Extensions", Proc. IWSSIP, Bratislava, Jun. 2008, doi: 10.1109/IWSSIP.2008.4604368, pp. 65-68.

(Continued)

*Primary Examiner* — Jesse Elbin
(74) *Attorney, Agent, or Firm* — Blakely, Sokoloff, Taylor & Zafman LLP

(57) ABSTRACT

An electronic audio apparatus is described that uses a digital audio filter in which a splitter separates an input frame of discrete time audio into different time interval portions. Separate digital filter blocks then operate in parallel upon those time interval portions, respectively. A combiner merges the filtered portions into a single audio channel signal. Other embodiments are also described and claimed.

15 Claims, 4 Drawing Sheets

(56) References Cited

OTHER PUBLICATIONS

Ordóñez, Prof. Rodrigo, "Simulating Reverberation", Spring 2011, University of Colorado at Boulder, DSP Lab, some materials referenced from class materials by: Prof. Clifford T. Mullis of the University of Colorado, 24 pages.

Välimäki, Vesa, "Suppression of Transients in Time-Varying Recursive Filters for Audio Signals", Proceedings of the 1998 IEEE International Conference on Acoustics, Speech and Signal Processing, vol. 6, Seattle, Washington, May 12-15, 1998, pp. 3569-3572.

* cited by examiner

PARALLEL DIGITAL FILTERING OF AN AUDIO CHANNEL

FIELD

An embodiment of the invention is related to digital audio signal processing. Other embodiments are also described.

BACKGROUND

A consumer's perception of sound produced by consumer electronics devices such as smart phones, tablet computers, desktop and laptop computers have become increasingly important. There is a need to provide the consumer with a rich aural experience, but to do so with often limited means. For example, to help compensate for non-idealities in the conversion of electrical audio signals into sound by a small speaker system such as one used in a multi-function portable device, a digital audio signal processing technique commonly referred to as EQ is used. EQ may be used to make the sound more uniform and therefore more smooth and full, or to improve intelligibility of speech that is present in the audio signal.

To impart EQ upon an audio signal, the signal, being a discrete time sequence, is passed through a digital filter that has a desired frequency response. The digital filter, in many instances, is implemented using an infinite impulse response (IIR) structure. An example of an IIR filter that is useful in digital audio processing is a bi-quad, which is another way of referring to a digital filter that has a bi-quadratic impulse response. A bi-quad (or other IIR filter) is a recursive filter in that each new result at its output depends on a previous result. Therefore, the IIR filter does not lend itself to parallel processing; its functionality cannot be divided into two or more portions that operate simultaneously or in parallel, upon the same input audio signal.

Some digital audio processors have multiple parallel processing units that allow multiple floating-point operations to occur in parallel. To increase the frequency of the process, hardware designers break floating-point operations into several parts so that several independent operations can utilize the same hardware. It is possible to implement two or more independent IIR filters that operate simultaneously (or in parallel). This technique is useful in the case of multi-channel audio where, for example, left channel and right channel audio streams are fed to a pair of IIR filters, respectively, where the filters are running simultaneously such that each channel is being processed in the same time interval as would be needed to process a single (left or right) channel. However, the IIR filtering (which are recursive operations) that is being performed on a single audio channel does not benefit from the available parallel processing capability, because its results are dependent on its previous result. Thus, even if a computing frequency of the floating-point processing is arguably increased, due to a greater number of stages in a given floating-point hardware unit, recursive operations do not see the benefits of it as they simply take more cycles to achieve the same result.

SUMMARY

A process for filtering an audio signal is described that may help improve performance by reducing the inherent delay in processing a single audio channel, using parallel digital filters. The process begins by receiving a frame of discrete time audio in a single audio channel, and time-splitting the frame into a first time interval portion and a second time interval portion. In other words, the single audio channel may be viewed as being split into two channels, where each channel encompasses a different time interval portion of the input (single) audio channel. Digital filtering is then performed in parallel, upon the first and second time interval portions. The filtered portions are then combined into a single (output) audio channel. The process described here may be applied in real-time to consecutive and essentially non-overlapping frames that make up the single input audio channel, where each frame is a sequence of digitized or sampled values of audio content that is part of a single audio channel. An advantage of such a technique may be to reduce the processing time required to perform, for example, EQ digital filtering upon the single input audio channel.

The process may be particularly advantageous when the digital filtering involves passing the first and second time interval portions through separate first and second IIR filters, respectively. Each of those IIR filters may have essentially identical transfer functions.

In one embodiment, the frame is time split in such a way that the first time interval portion extends from about the start of the frame to about a midway point of the frame plus a transient response time of the first IIR filter (also referred to as a "ringing" distance of the filter). The second time interval portion extends from about the midway point minus a transient response time of the second IIR filter, to about the end of the frame. Also, different techniques may be used for combining the filtered first and second portions into a single audio channel signal.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. While numerous details are set forth, it is understood that some embodiments of the invention may be practiced without these details. In other instances, well-known circuits, structures, and techniques have not been shown in detail so as not to obscure the understanding of this description.

Figure 1:
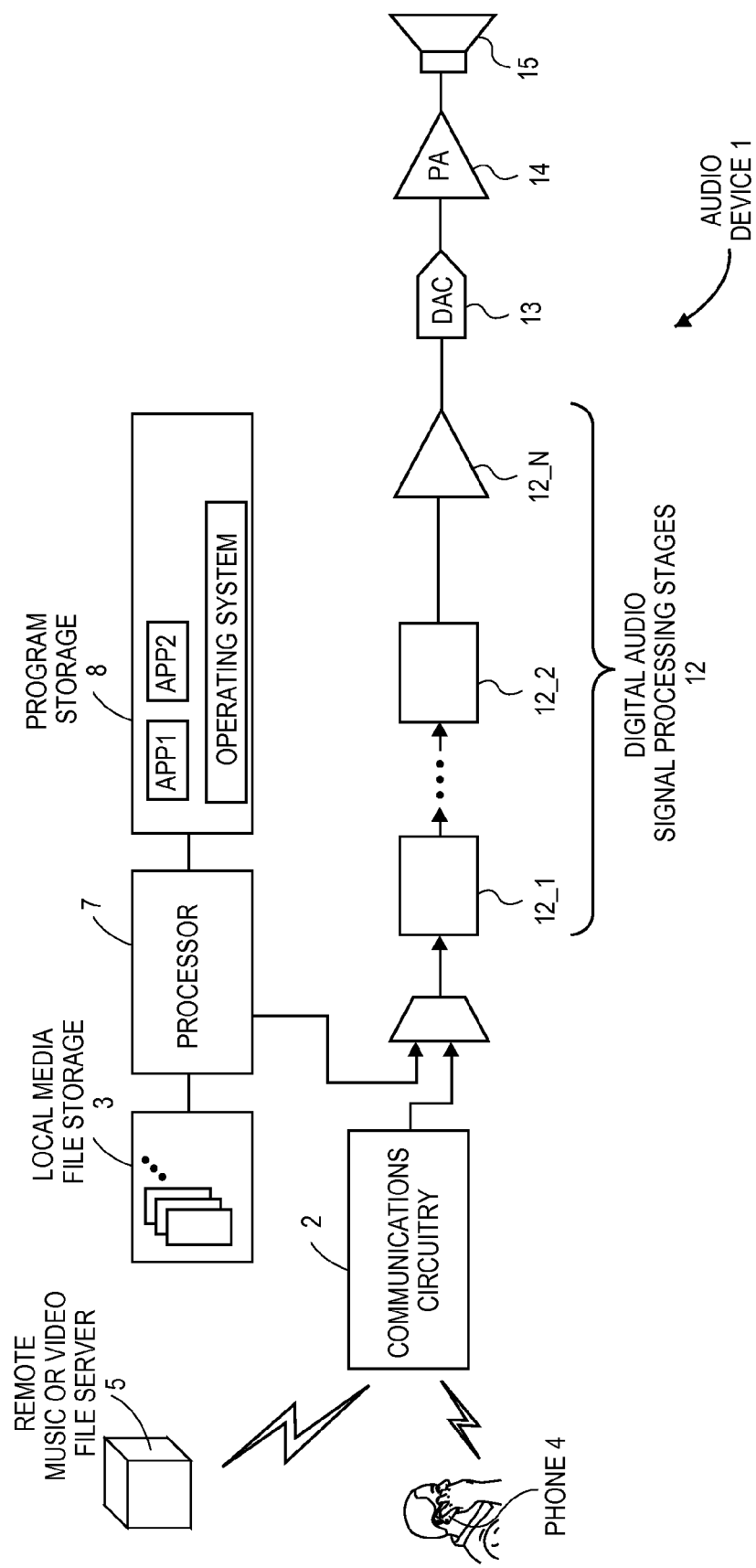
FIG. 1 is a block diagram of relevant components of an audio device in which a process for filtering an audio signal in accordance with an embodiment of the invention may be implemented.

FIG. 1 is a block diagram of relevant components of an audio device in which a process for filtering an audio signal may be implemented. The audio device 1 may be a consumer electronic audio output device such as a desktop computer, a notebook or laptop computer, a tablet computer, a smart phone, or an in-home or in-vehicle audio-video entertainment system. The source of the audio signal (that will be converted to sound through a speaker 15) may be communications circuitry 2 which receives the audio signal in the form of a downlink communications signal from a remote music or video file server 5 (e.g., a music or movie stream over the Internet). The audio signal may alternatively contain speech from a phone 4 of a far-end user that is engaged in a two-way voice communications session with a near-end user (not shown) of the audio device 1. The session in that case may be generically referred to as a voice call or it may be a video call. As yet another possibility, the audio signal may be originated by a processor 7 reading a music file or a movie file that is stored in a local media file storage 3 within a housing (not shown) of the audio device 1. The processor 7 may be programmed in accordance with an operating system and one or more application programs (e.g., app1, app2), which are stored in program storage 8, typically also located within the housing of the audio device 1. The local media file storage 3 and the program storage 8 may be implemented as articles of manufacture having machine-readable media such as non-volatile solid-state memory (e.g., flash memory, rotating magnetic disk drive, or a combination thereof). The processor 7 is programmed in accordance with, or is to execute, instructions within an application app1 or app2, to perform the operations of a process for playing an audio signal through the speaker 15, e.g. a digital media player, a telephony application.

The selected audio signal, which in this case is in digital form, is provided to a group of audio signal processing stages 12. Depending on the source or type of signal, the signal processing stages 12 may vary, so as to enhance the quality of the sound that is ultimately produced through the speaker 15. For example, in the case of a downlink signal containing speech of a far-end user of a communications network, these stages may include one or more of the following: automatic gain control, noise reduction, equalization, acoustic echo cancellation, and compression or expansion. Most of these stages are expected to be linear and hence their order is immaterial; however, in some cases there may be a non-linear operation, such as compression and expansion, in which case the order may be of consequence. In another instance, the selected audio signal may be a single channel taken from a multi-channel music or movie file, e.g. a surround sound audio file. It should, however, be noted that the selected audio signal, while itself being a single audio channel or bit stream, my have been derived from multiple audio channels (e.g., from multiple, discrete microphone signals such as by a beam forming process, or synthesized from a multi-channel sound source such as a 5.1 surround sound or AC3 file.

Once all of the desired digital signal processing has been performed upon the discrete time sequence audio signal, including in some cases a gain adjustment in accordance with the current volume setting that may have been manually selected by a user of the device 1, the signal is converted into analog form by a digital-to-analog converter (DAC) 13. The resulting analog or continuous time signal is then amplified by an audio power amplifier 14. The output of the power amplifier 14 then drives the speaker 15, which in turn converts the audio signal into sound waves.

Figure 2:
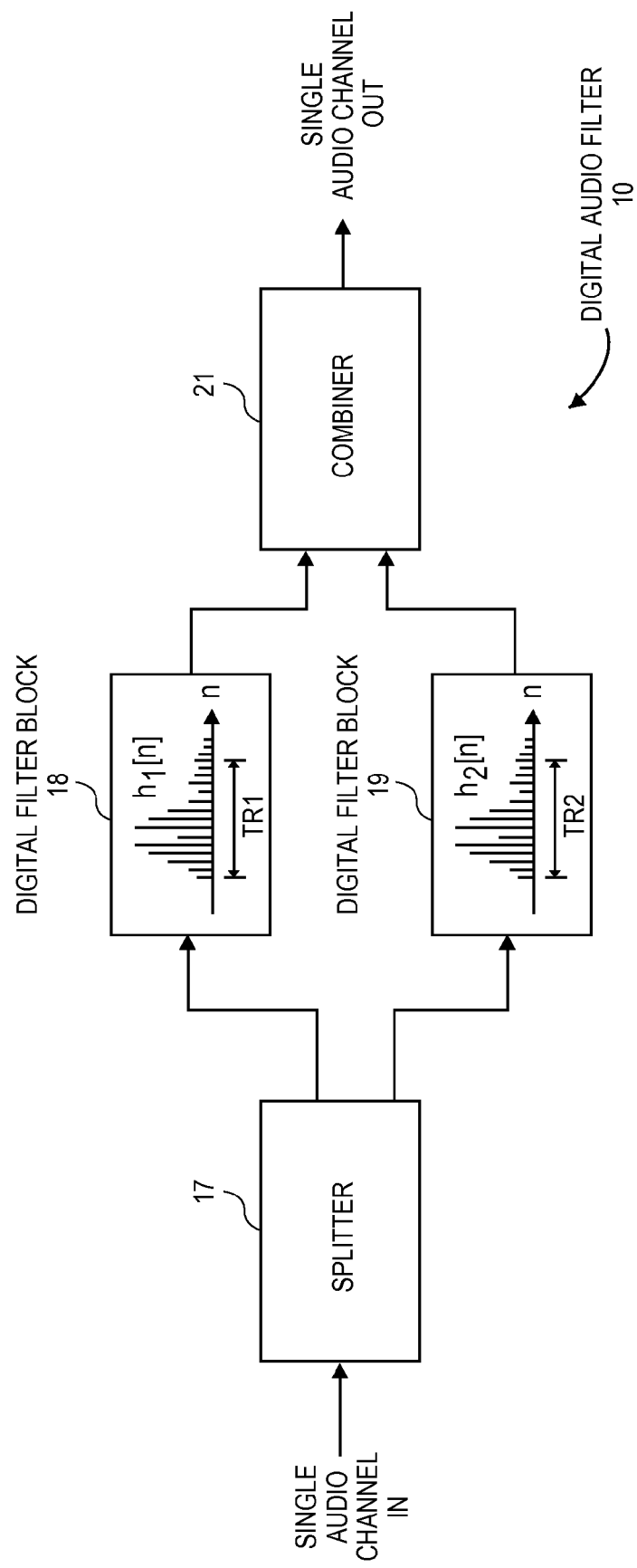
FIG. 2 is a block diagram of a digital audio filter in accordance with an embodiment of the invention.

Turning now to FIG. 2, what is shown is a block diagram of a digital audio filter 10 in accordance with an embodiment of the invention. The filter 10 may be one of the digital audio signal processing stages 12 shown in FIG. 1, such as an equalization (e.g., EQ) stage.

A splitter 17 serves to receive an input frame of discrete time audio, also referred to as a single audio channel frame, and then split the frame into a first discrete time interval portion and a second discrete time interval portion. The input frame may be received within a buffer (not shown) that is part of the splitter 17. This buffer may be sufficiently large so that it can store simultaneously at least one frame of the input audio channel (see e.g., FIG. 3). The splitter 17 feeds the first interval portion to a digital filter block 18 simultaneously with the second interval portion being fed to a separate digital filter block 19. The digital filter blocks 18, 19 are to thus operate in parallel upon their respective input interval portions, so as to produce respective filtered first and second interval portions. Those are then combined into a single audio channel signal, by a combiner 21. Timing diagrams that help illustrate the operations of the splitter 17, combiner 21, and filter blocks 18, 19 are depicted in FIG. 3 and in FIG. 4.

Figure 3:
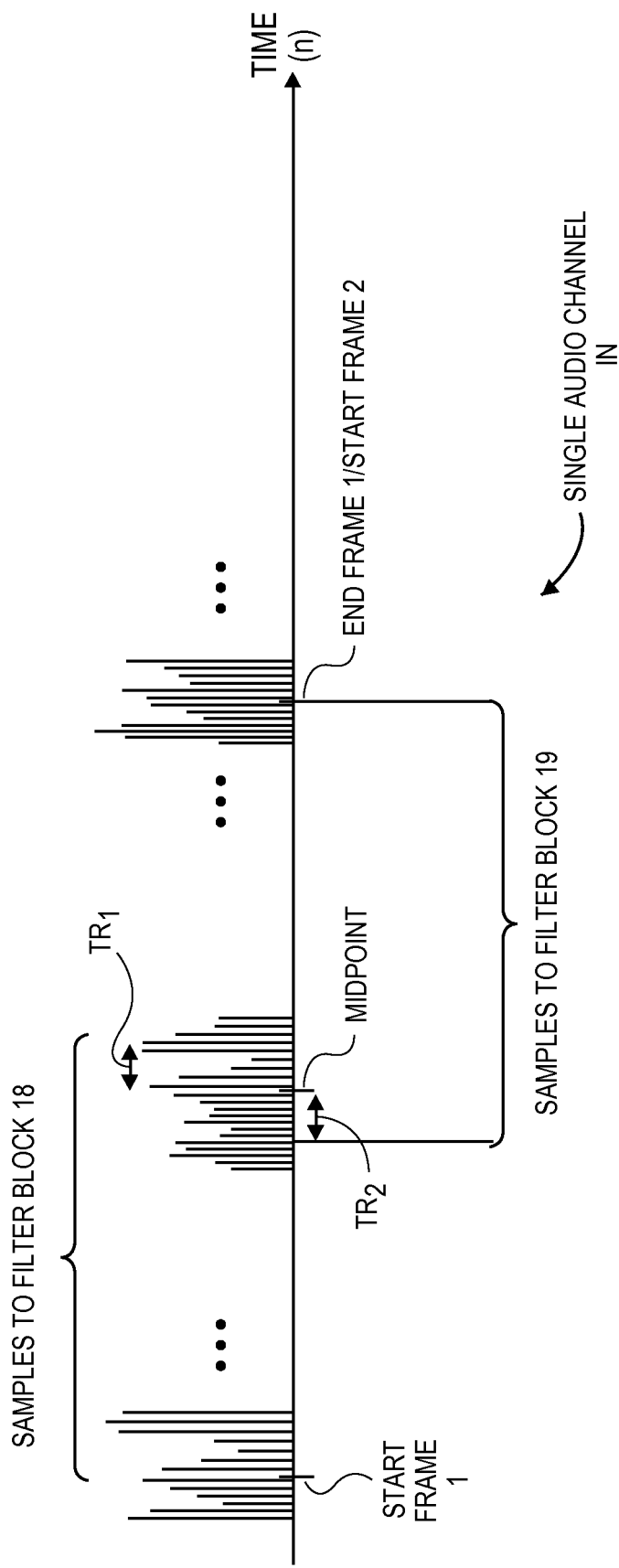
FIG. 3 shows an example discrete time sequence of an input audio channel.

The splitter 17 includes buffering and other data structures that, referring now to FIG. 3, provide the two interval portions or samples to the filter blocks 18, 19. In the example shown, the first time interval portion (samples fed to filter block 18) extend from about the start of the frame (start frame 1) to about a midway point (midpoint) of the frame plus a transient response time $TR_1$ of the first filter block 18. In contrast, the second time interval portion (samples fed to filter block 19) extend from about the midway point (midpoint) minus a transient response time of the filter block 19, to about the end of the frame (end frame 1). In the example shown in FIG. 3, the frames are sequential such that the end of frame 1 essentially coincides with the start of frame 2. It should be understood that the splitter 17 may essentially repeat the operation depicted in FIG. 3 upon each successive frame.

As depicted in FIG. 3, the samples fed to filter block 18 (first interval portion), exceed the midpoint of the frame by a number of samples that cover the transient response time or interval $TR_1$. The transient response time $TR_1$ may be the ring-down time interval needed for the output of the filter block 18 to essentially die out, in response to an impulse stimulus at its input. This is depicted in FIG. 2, as the time interval $TR_1$ covers the majority of the meaningful signal content in the impulse response $h_1[n]$ of the filter block 18. In contrast, the samples fed to filter block 19 (second time interval portion) go back behind the midpoint of the frame by the amount $TR_2$, which is the transient response time of the filter block 19 (see FIG. 2, where $TR_2$ is depicted as covering the majority of the impulse response $h_2[n]$).

Another way to view the transient response time may be that it represents the warm-up time interval needed for the output of a given filter block 18 or 19, to settle down to a steady state, in response to a discontinuity at the input of that filter block. The discontinuity at the input may be, for example, the initial start up signal fed to the filter block. In yet another embodiment, the transient response time may be defined as the time interval needed for the filter block 18 or 19 to "pass through" its transient behavior, so that its transient behavior no longer dominates the output of that filter block. One of ordinary skill in the art will understand that the transient response time of a given filter block, or in some cases referred to here as the ringing distance, is variable such that it depends on, in part, the coefficients of that filter block.

Turning now to the combiner 21, this unit may serve to time-align and apply a cross-fade mixing algorithm to the filtered first and second time interval portions (from the outputs of the filter blocks 18, 19) in order to form a single audio channel signal. This may be in accordance with the example waveforms depicted in FIG. 4. The combiner 21 contains sufficient buffering and data structures that enable it to merge an end section or end sub-portion of the sequence received from the filter block 18, with a start section or start sub-portion of the sequence received from the filter block 19. In one embodiment, the first and second time interval portions are essentially non-overlapping, that is they may have at most a handful of overlapping samples (at the end section of the first interval portion and at the start section of second interval portion. In one embodiment, the combiner 21 may essentially drop the samples that are in the start sub-portion of the output from filter block 19 (the second filtered time interval portion), where the start sub-portion may be about as long as a warming interval of the filter block 19. Other techniques for combining or merging the outputs of the filter blocks 18, 19 are possible including one where the cross-fade mixing algorithm may be omitted.

With respect to the digital filter blocks 18, 19, these may be separate IIR filters which may have essentially identical transfer functions $h_1[n]$ and $h_2[n]$. Such IIR filters may be in accordance with those that are typically used in an audio EQ process, having a shaped but linear frequency response. As an example, the IIR filter block may be a bi-quad filter block, and, in particular, one that is implemented such that it operates entirely in discrete time domain (and not in frequency domain).

As explained above, an embodiment of the invention may be a machine-readable medium (such as microelectronic memory) having stored thereon instructions, which program one or more data processing components (generically referred to here as a "processor") to perform digital audio processing operations as described above. In other embodiments, some of these operations might be performed by specific hardware components that contain hardwired logic (e.g., dedicated hardwired digital filter blocks, and state machines). Those operations might alternatively be performed by any combination of programmed data processing components and fixed hardware circuit components.

Figure 4:
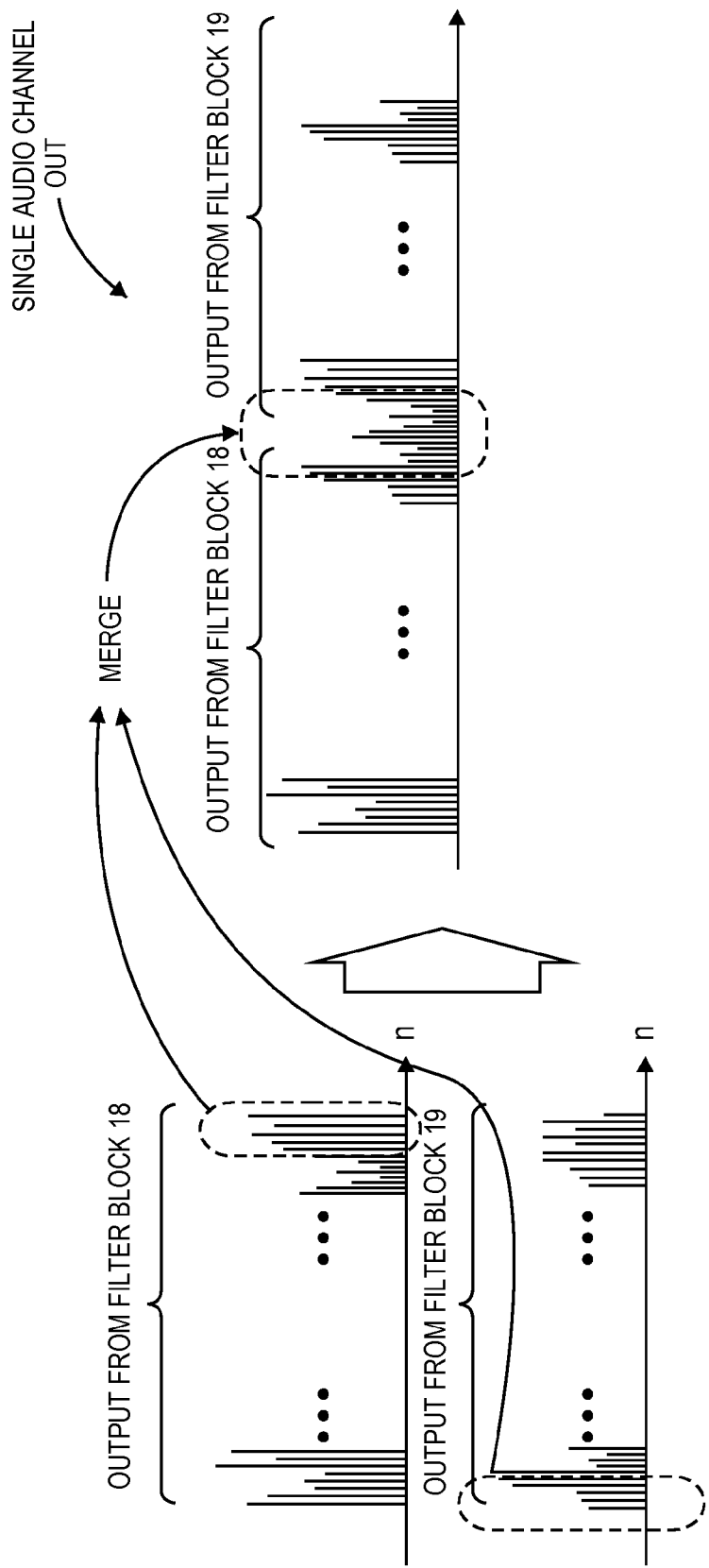
FIG. 4 shows an example of discrete time sequences at the outputs of the parallel filters, being merged into an output audio channel.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. For example, the digital audio filter 10 of FIG. 2 was described above as being useful as a stage of a downlink signal processing chain in a two-way real-time communications device, such as the one depicted in FIG. 1; the filter 10 however could also be useful as a stage of an uplink signal processing chain (not shown) in the two-way real-time communications device. Also, FIGS. 2-4 depict an embodiment where there may be only two parallel digital filter blocks 18, 19 (corresponding to the splitting of each frame of the input audio channel into just two, substantially equal length, time interval portions). As an alternative, the frame may be separated or divided into more than two essentially non-overlapping time-interval portions, each to be processed by its own separate digital filter block in parallel and then combined in the correct order, to form a single output audio channel. In addition, the time interval portions need not be of equal length, i.e. one time interval portion may have a substantially greater number of samples than another. The description is thus to be regarded as illustrative instead of limiting.

What is claimed is:
1. A method for filtering an audio signal, comprising:
   receiving a frame of discrete time audio in a single audio channel;
   time-splitting the frame into a first time interval portion and a second time interval portion;
   digital filtering in parallel the first and second time interval portions, wherein said digital filtering comprises passing the first and second portions through separate first and second IIR filters, respectively; and
   combining the filtered first and second portions into a single audio channel signal,
   wherein said time-splitting the frame yields a) the first time interval portion being from a first time of the frame to a second time of the frame plus an amount of time corresponding to a transient response time of the first IIR filter, and b) the second time interval portion being from the second time of the frame minus an amount of time corresponding to a transient response time of the second IIR filter to a third time of the frame.
2. The method of claim 1 wherein said digital filtering comprises an audio EQ process.
3. The method of claim 1 wherein said combining comprises
   time-aligning and applying a cross-fade mixing algorithm to the filtered first and second portions, to form the single audio channel signal.
4. The method of claim 1 wherein the first time of the frame is at about a start of the frame, the second time of the frame is at about a midway point of the frame, and the third time of the frame is at about an end of the frame.
5. The method of claim 4 wherein said digital filtering comprises
   passing the first and second portions through separate first and second IIR filters that have essentially identical transfer functions.
6. The method of claim 5 wherein a ringing distance is variable and depends on coefficients of the IIR filters.
7. An electronic audio apparatus comprising:
   a digital audio filter having
      a splitter to separate an input frame of discrete time audio into a first discrete time interval portion and a second discrete time interval portion,
      a first digital filter block and a second digital filter block to operate in parallel upon the first and second time interval portions, respectively, wherein both of said first and second digital filter blocks are IIR filter blocks, and
      a combiner to merge the filtered first and second portions into a single audio channel signal,
   wherein a) the first discrete time interval portion is from a first time of the frame to a second time of the input frame plus an amount of time corresponding to a transient response time of the first digital filter block, and b) the second discrete time interval portion is from the second time of the frame minus an amount of time corresponding to a transient response time of the second digital filter block to a third time of the input frame.
8. The apparatus of claim 7 wherein said first and second digital filter blocks are essentially identical.
9. The apparatus of claim 7 wherein both of said first and second digital filter blocks are bi-quad filter blocks.
10. The apparatus of claim 7 wherein both of said first and second digital filter blocks operate entirely in discrete time domain and not in frequency domain.
11. The apparatus of claim 7 wherein said digital audio filter is an equalization filter.

12. The apparatus of claim 7 wherein the combiner is to time-align and apply a cross-fade mixing algorithm to a) an end sub-portion of the filtered first portion and b) a start sub-portion of the second filtered portion.

13. The apparatus of claim 7 wherein the combiner is to essentially drop the samples in a start sub-portion of the second filtered portion, wherein the start sub-portion is about as long as a warming interval of the second digital filter block.

14. The apparatus of claim 7 wherein the first time of the input frame is at about a start of the frame, the second time of the frame is at about a midway point of the input frame, and the third time of the frame is at about an end of the input frame.

15. The apparatus of claim 7 wherein a ringing distance is variable and depends on coefficients of the IIR filter blocks.

* * * * *